(12) United States Patent
Basu et al.

(10) Patent No.: US 9,196,711 B2
(45) Date of Patent: Nov. 24, 2015

(54) FIN FIELD EFFECT TRANSISTOR INCLUDING SELF-ALIGNED RAISED ACTIVE REGIONS

(71) Applicant: International Business Machines Corporation, Armonk, NY (US)

(72) Inventors: Anirban Basu, Elmsford, NY (US); Guy M. Cohen, Mohegan Lake, NY (US); Amlan Majumdar, White Plains, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 14/200,851

(22) Filed: Mar. 7, 2014

(65) Prior Publication Data

US 2015/0255570 A1   Sep. 10, 2015

(51) Int. Cl.
*H01L 29/76* (2006.01)
*H01L 29/66* (2006.01)
*H01L 29/78* (2006.01)
*H01L 29/20* (2006.01)

(52) U.S. Cl.
CPC ............ *H01L 29/6681* (2013.01); *H01L 29/20* (2013.01); *H01L 29/785* (2013.01); *H01L 29/7841* (2013.01)

(58) Field of Classification Search
USPC ........................................................ 257/288
See application file for complete search history.

(56) References Cited

U.S. PATENT DOCUMENTS

| | | |
|---|---|---|
| 7,745,851 B2 | 6/2010 | Harris |
| 7,799,592 B2 | 9/2010 | Lochtefeld |
| 8,415,751 B2 | 4/2013 | Mukherjee et al. |
| 2008/0224183 A1 | 9/2008 | Nawaz |
| 2009/0302402 A1* | 12/2009 | Anderson et al. ............. 257/411 |
| 2011/0156004 A1 | 6/2011 | Radosavljevic et al. |
| 2012/0313170 A1 | 12/2012 | Chang et al. |
| 2014/0183597 A1* | 7/2014 | Lee et al. ...................... 257/190 |
| 2014/0264607 A1* | 9/2014 | Basu et al. ..................... 257/365 |

(Continued)

FOREIGN PATENT DOCUMENTS

KR    10-2007-0052454 A    5/2007

OTHER PUBLICATIONS

Wu et al, "First Experimental Demonstration of 100 nm Inversion-mode InGaAs FinFET through Damage-free Sidewall Etching",. p. 1-4, Electron Devices Meetings (IEDM), IEEE International, 2009.*

*Primary Examiner* — Asok K Sarkar

(74) *Attorney, Agent, or Firm* — Scully, Scott, Murphy & Presser, P.C.; Louis J. Percello, Esq.

(57) ABSTRACT

Fin mask structures are formed over a semiconductor material portion on a crystalline insulator layer. A disposable gate structure and a gate spacer are formed over the fin mask structures. Employing the disposable gate structure and the gate spacer as an etch mask, physically exposed portions of the fin mask structures and the semiconductor material portion are removed by an etch. A source region and a drain region are formed by selective epitaxy of a semiconductor material from physically exposed surfaces of the crystalline insulator layer. The disposable gate structure is removed selective to the source region and the drain region. Semiconductor fins are formed by anisotropically etching portions of the semiconductor material portion, employing the gate spacer and the fin mask structures as etch masks. A gate dielectric and a gate electrode are formed within the gate cavity.

10 Claims, 13 Drawing Sheets

(56) References Cited

U.S. PATENT DOCUMENTS

2014/0319624 A1* 10/2014 Chi et al. ............. 257/401
2015/0054092 A1* 2/2015 Cohen et al. ............. 257/401
2015/0140758 A1* 5/2015 Huang et al. ............. 438/283

* cited by examiner

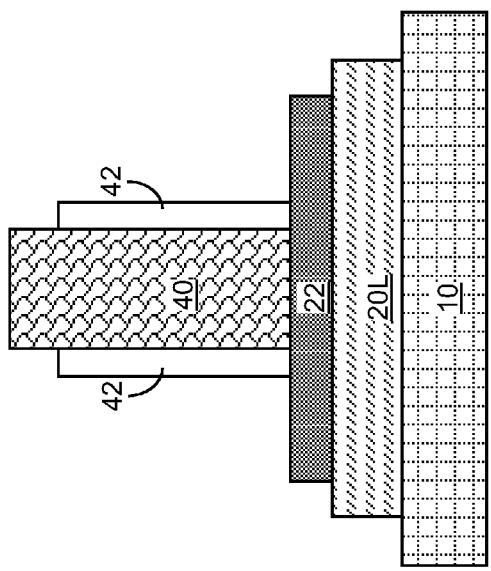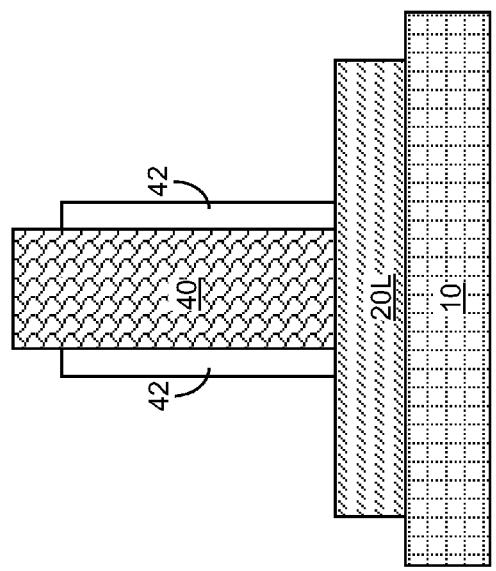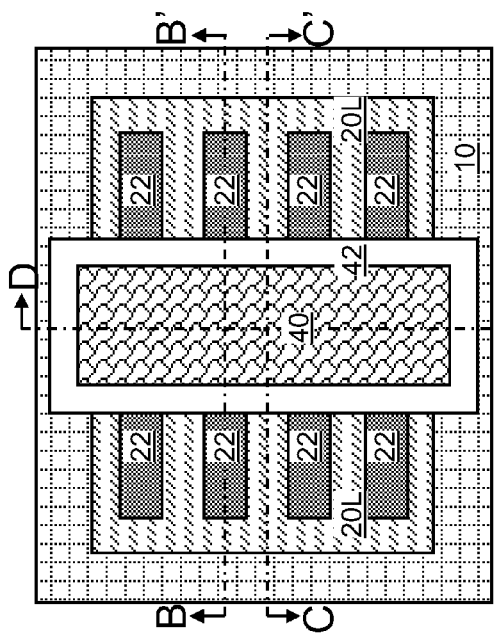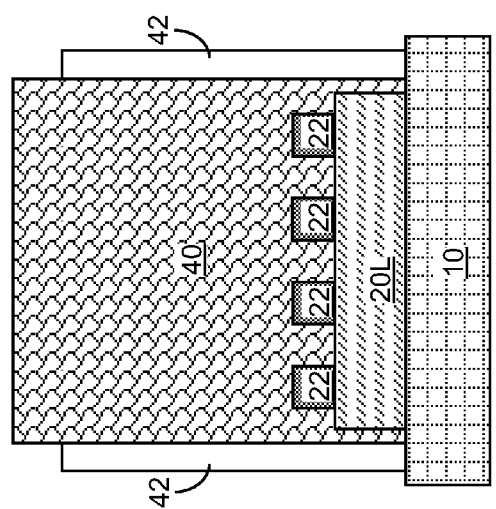

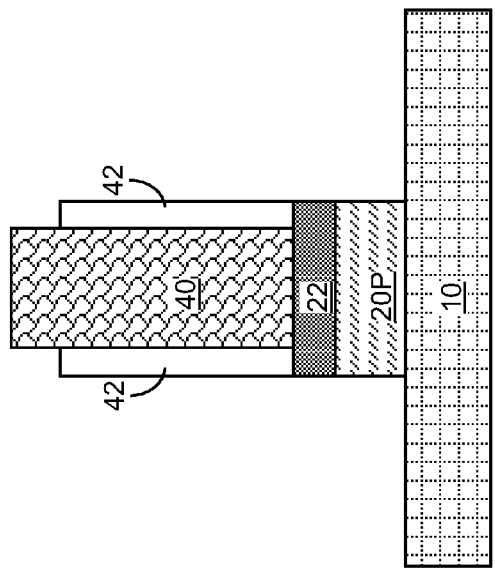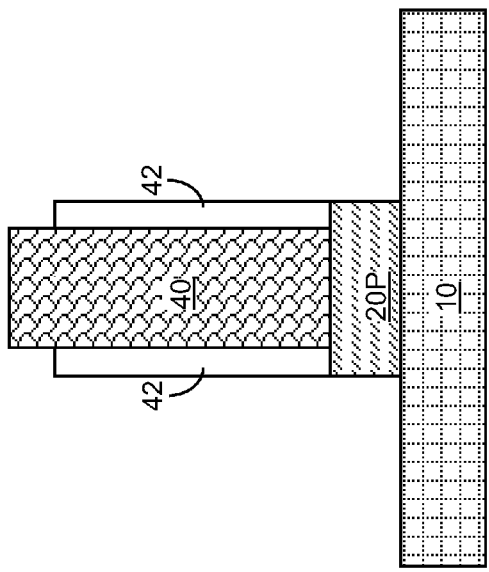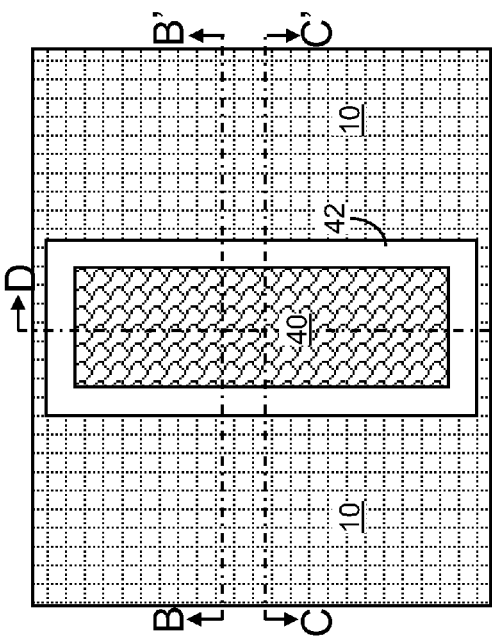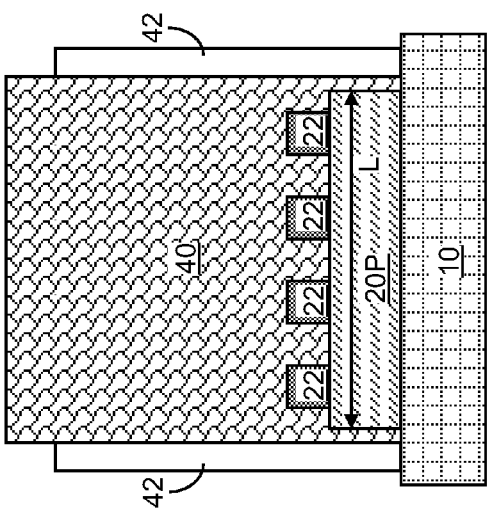

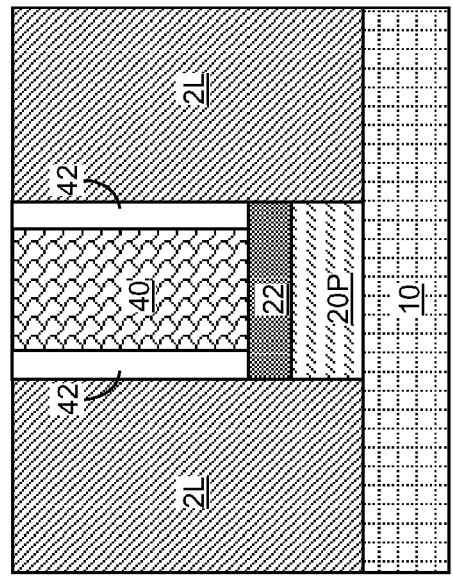
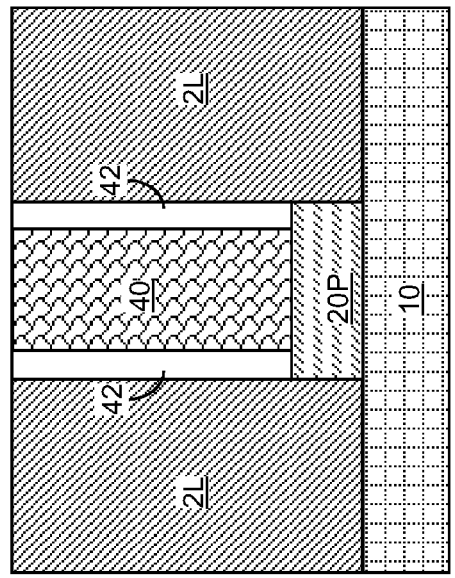
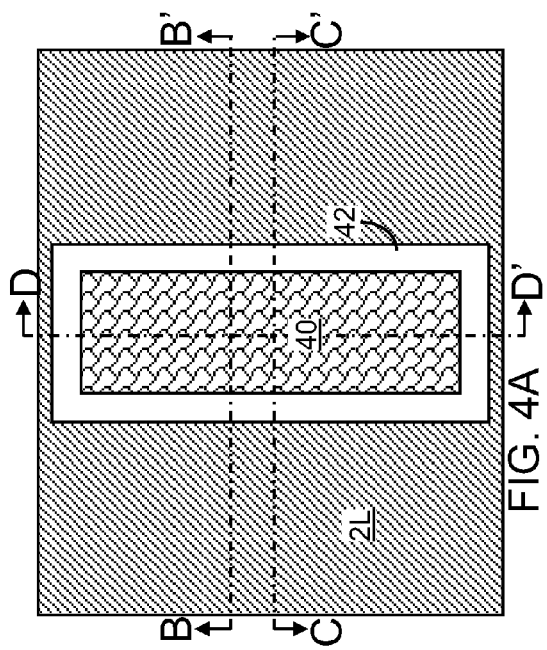
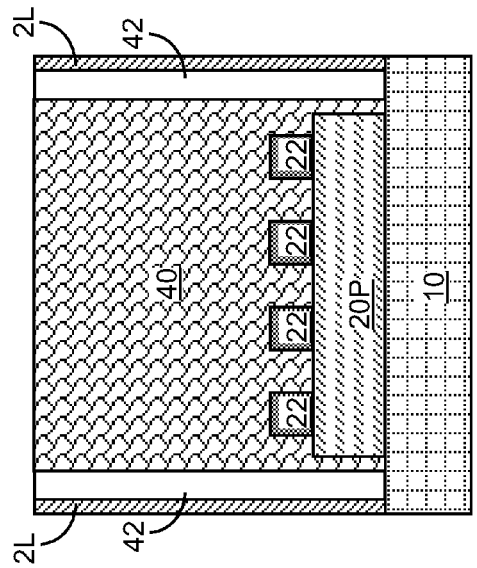
FIG. 4A
FIG. 4B
FIG. 4C
FIG. 4D

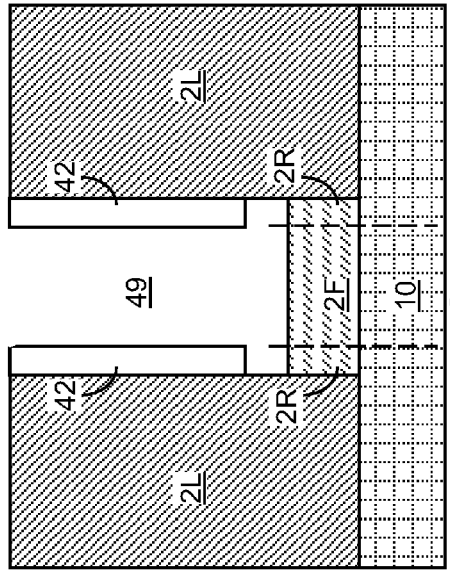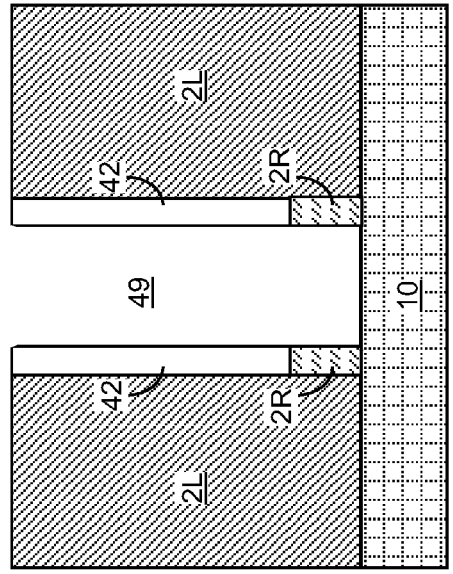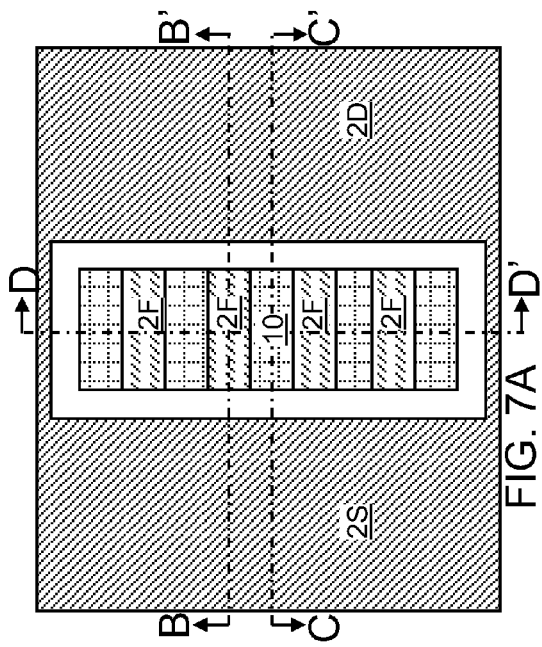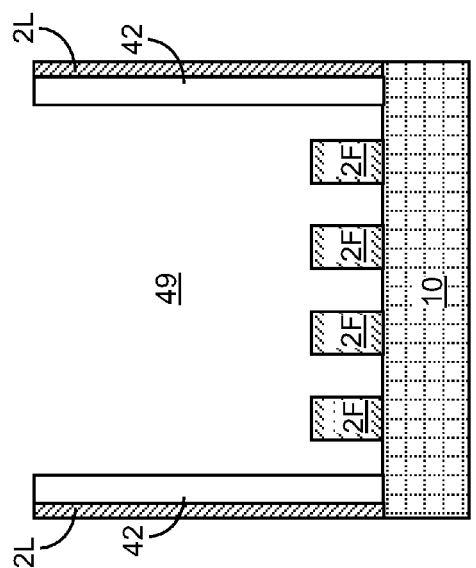

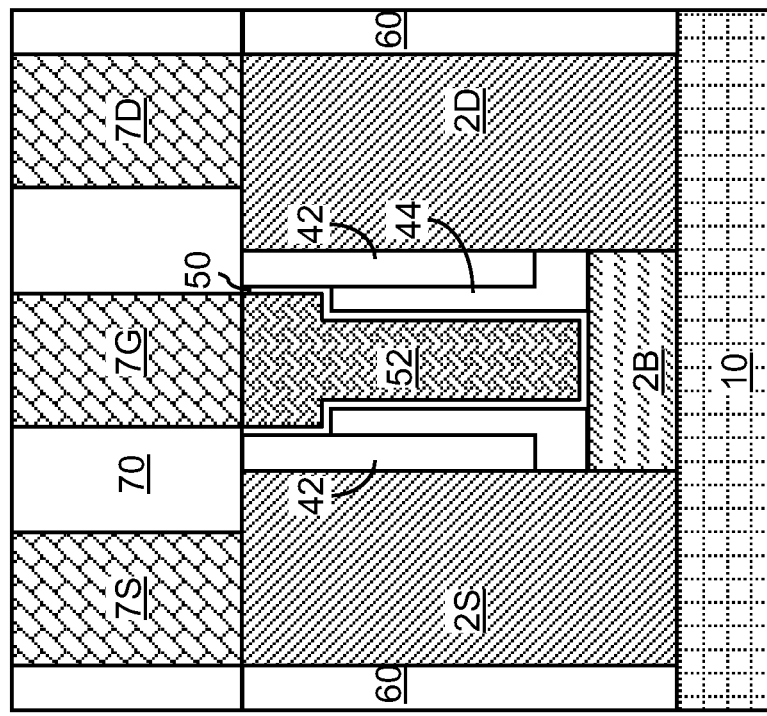
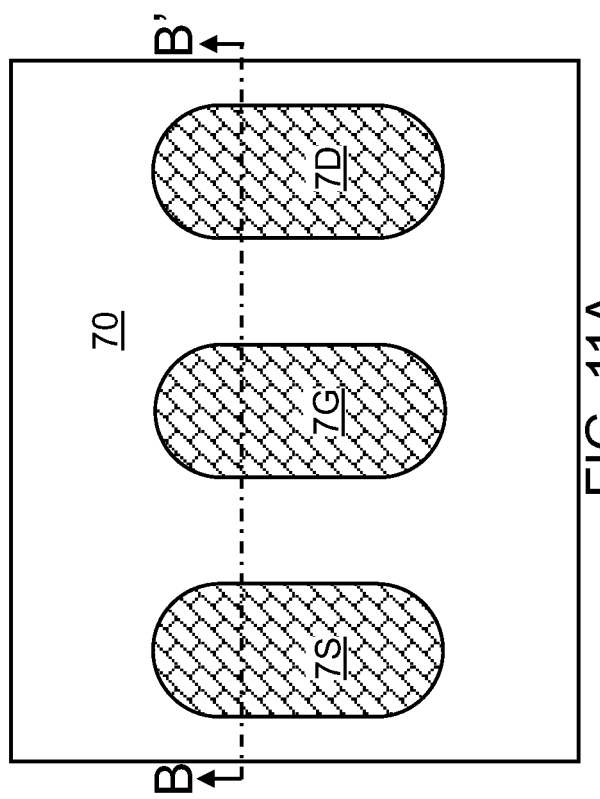

FIN FIELD EFFECT TRANSISTOR INCLUDING SELF-ALIGNED RAISED ACTIVE REGIONS

BACKGROUND

The present disclosure relates to a semiconductor structure, and particularly to a fin field effect transistor (finFET) including self-aligned raised active regions, and a method of manufacturing the same.

Fin field effect transistors can increase the on-current per unit width relative to planar field effect transistors. Additionally, fin field effect transistors are implemented as double-gate structure that provides better short channel characteristics and therefore enables further scaling of the device gate length. Advanced fin field effect transistors require source and drain regions that are aligned to a gate electrode and a channel in a manner that minimizes variations in performance. This requirement is more relevant to fin field effect transistors employing a compound semiconductor material such as a III-V compound semiconductor material. Further, material compatibility and thermal budget constraint for processing steps severely limit the capabilities of a fin field effect transistor employing a compound semiconductor material.

SUMMARY

Fin mask structures are formed over a semiconductor material portion on a crystalline insulator layer. A disposable gate structure and a gate spacer are formed over the fin mask structures. Employing the disposable gate structure and the gate spacer as an etch mask, physically exposed portions of the fin mask structures and the semiconductor material portion are removed by an etch. A source region and a drain region are formed by selective epitaxy of a semiconductor material from physically exposed surfaces of the crystalline insulator layer. The disposable gate structure is removed selective to the source region and the drain region to form a gate cavity. Semiconductor fins are formed as the gate cavity is extended by anisotropically etching portions of the semiconductor material portion, employing the gate spacer and the fin mask structures as etch masks. A gate dielectric and a gate electrode are formed within the gate cavity.

According to an aspect of the present disclosure, a semiconductor structure includes a single crystalline insulator layer, and a semiconductor material portion located on, and in epitaxial alignment with, the single crystalline insulator layer. The semiconductor material portion includes at least one semiconductor fin, a first end portion adjoined to one end of each of the at least one semiconductor fin, and a second end portion adjoined to another end of each of the at least one semiconductor fin. Each of the first and second end portions laterally extends farther than a width of any of the at least one semiconductor fin. The semiconductor structure further includes a gate stack containing a gate dielectric and a gate electrode and overlying the at least one semiconductor fin, a source region contacting the first end portion and epitaxially aligned to the single crystalline insulator layer, and a drain region contacting the second end portion and epitaxially aligned to the single crystalline insulator layer.

According to another aspect of the present disclosure, a method of forming a semiconductor structure is provided. At least one fin-defining mask structure is formed over a semiconductor material portion on an insulator layer. A disposable gate structure and a gate spacer are formed over the at least one fin-defining mask structure. Physically exposed portions of the at least one fin-defining mask structure and the semiconductor material portion are etched employing the disposable gate structure and the gate spacer as an etch mask. The disposable gate structure is removed selective to the gate spacer. At least one semiconductor fin is formed by etching the semiconductor material portion employing the gate spacer and the at least one fin-defining mask structure as an etch mask. A gate stack including a gate dielectric and a gate electrode is formed over the at least one semiconductor fin.

BRIEF DESCRIPTION OF SEVERAL VIEWS OF THE DRAWINGS

FIG. 2A is a top-down view of the exemplary semiconductor structure after formation of a disposable gate structure and an outer gate spacer according to an embodiment of the present disclosure.

FIG. 2B is a vertical cross-sectional view of the exemplary semiconductor structure along the vertical plane B-B' of FIG. 2A.

FIG. 2C is a vertical cross-sectional view of the exemplary semiconductor structure along the vertical plane C-C' of FIG. 2A.

FIG. 2D is a vertical cross-sectional view of the exemplary semiconductor structure along the vertical plane D-D' of FIG. 2A.

FIG. 3A is a top-down view of the exemplary semiconductor structure after removal of portions of the semiconductor material layer that are not covered by the disposable gate structure and the outer gate spacer according to an embodiment of the present disclosure.

FIG. 3B is a vertical cross-sectional view of the exemplary semiconductor structure along the vertical plane B-B' of FIG. 3A.

FIG. 3C is a vertical cross-sectional view of the exemplary semiconductor structure along the vertical plane C-C' of FIG. 3A.

FIG. 3D is a vertical cross-sectional view of the exemplary semiconductor structure along the vertical plane D-D' of FIG. 3A.

FIG. 4A is a top-down view of the exemplary semiconductor structure after formation of a source region and a drain region according to an embodiment of the present disclosure.

FIG. 4B is a vertical cross-sectional view of the exemplary semiconductor structure along the vertical plane B-B' of FIG. 4A.

FIG. 4C is a vertical cross-sectional view of the exemplary semiconductor structure along the vertical plane C-C' of FIG. 4A.

FIG. 4D is a vertical cross-sectional view of the exemplary semiconductor structure along the vertical plane D-D' of FIG. 4A.

FIG. 7A is a top-down view of the exemplary semiconductor structure after optional removal of the plurality of fin-defining mask structures according to an embodiment of the present disclosure.

FIG. 7B is a vertical cross-sectional view of the exemplary semiconductor structure along the vertical plane B-B' of FIG. 7A.

FIG. 7C is a vertical cross-sectional view of the exemplary semiconductor structure along the vertical plane C-C' of FIG. 7A.

FIG. 7D is a vertical cross-sectional view of the exemplary semiconductor structure along the vertical plane D-D' of FIG. 7A.

FIG. 11A is a top-down view of the exemplary semiconductor structure after formation of a contact level dielectric layer and contact via structures according to an embodiment of the present disclosure.

FIG. 11B is a vertical cross-sectional view of the exemplary semiconductor structure along the vertical plane B-B' of FIG. 11A.

DETAILED DESCRIPTION

Figure 1B:
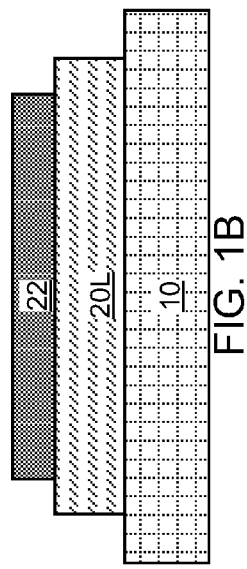
FIG. 1B is a vertical cross-sectional view of the exemplary semiconductor structure along the vertical plane B-B' of FIG. 1A.
Figure 1C:
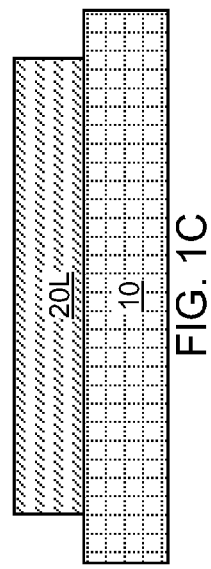
FIG. 1C is a vertical cross-sectional view of the exemplary semiconductor structure along the vertical plane C-C' of FIG. 1A.
Figure 1A:
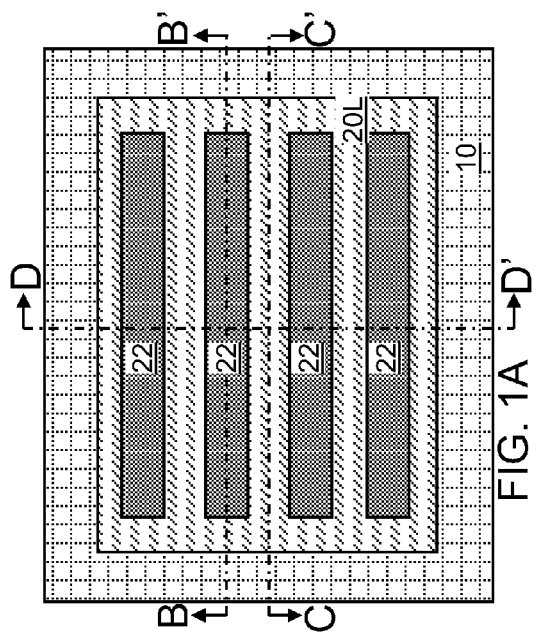
FIG. 1A is a top-down view of an exemplary semiconductor structure after formation of a plurality of fin-defining mask structures on a semiconductor material layer according to an embodiment of the present disclosure.
Figure 1D:
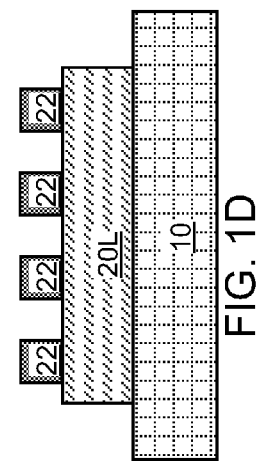
FIG. 1D is a vertical cross-sectional view of the exemplary semiconductor structure along the vertical plane D-D' of FIG. 1A.
Figure 5A:
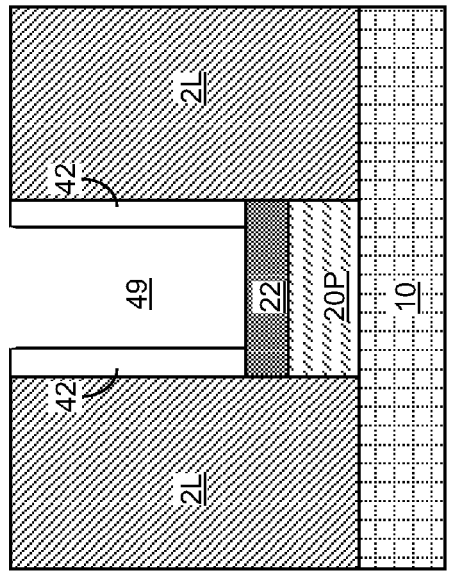
FIG. 5A is a top-down view of the exemplary semiconductor structure after formation of a gate cavity by removal of the disposable gate structure according to an embodiment of the present disclosure.
Figure 5B:
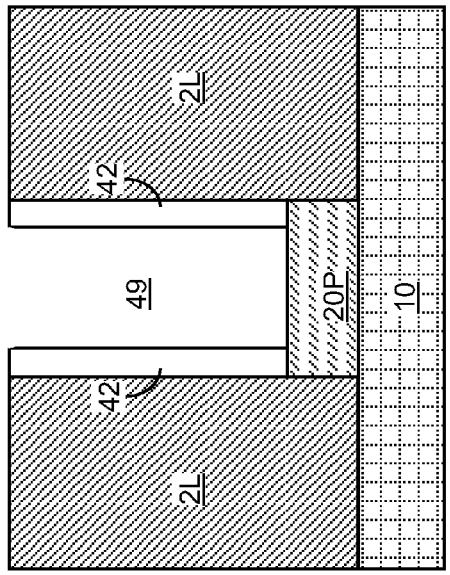
FIG. 5B is a vertical cross-sectional view of the exemplary semiconductor structure along the vertical plane B-B' of FIG. 5A.
Figure 5D:
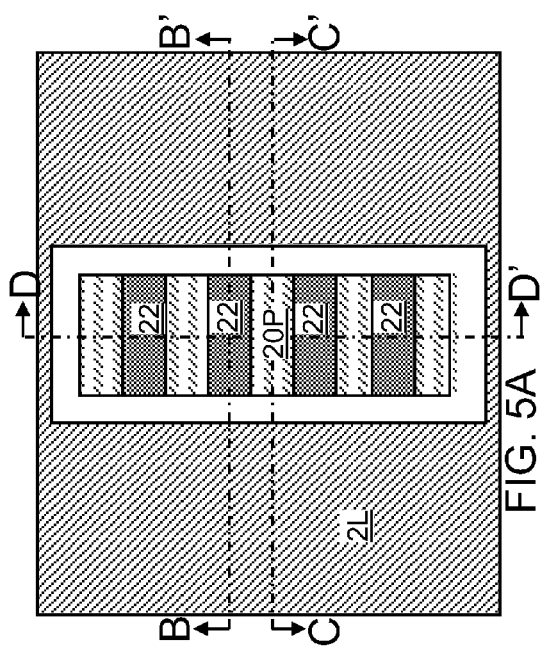
FIG. 5D is a vertical cross-sectional view of the exemplary semiconductor structure along the vertical plane D-D' of FIG. 5A.
Figure 5C:
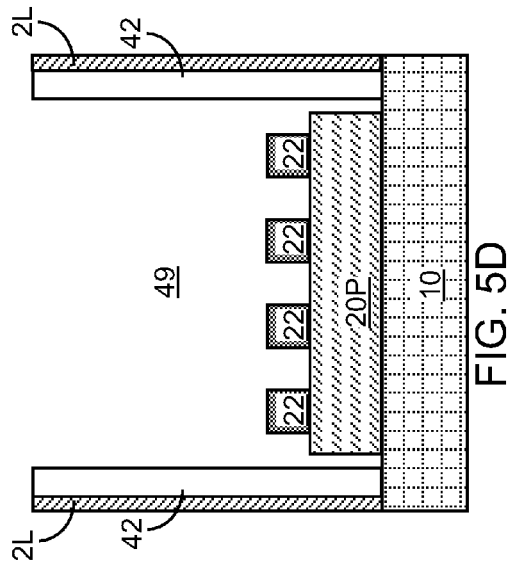
FIG. 5C is a vertical cross-sectional view of the exemplary semiconductor structure along the vertical plane C-C' of FIG. 5A.
Figure 6A:
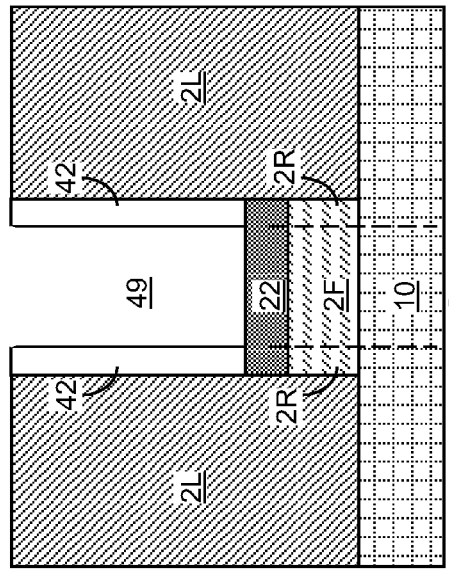
FIG. 6A is a top-down view of the exemplary semiconductor structure after formation of a plurality of semiconductor fins by an etch that employs the plurality of fin-defining mask structures as an etch mask according to an embodiment of the present disclosure.
Figure 6B:
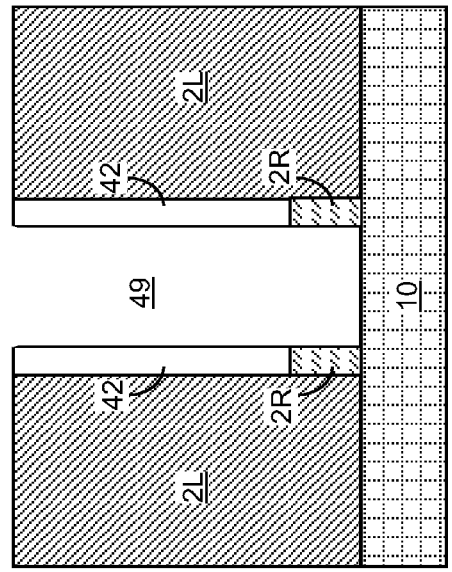
FIG. 6B is a vertical cross-sectional view of the exemplary semiconductor structure along the vertical plane B-B' of FIG. 6A.
Figure 6C:
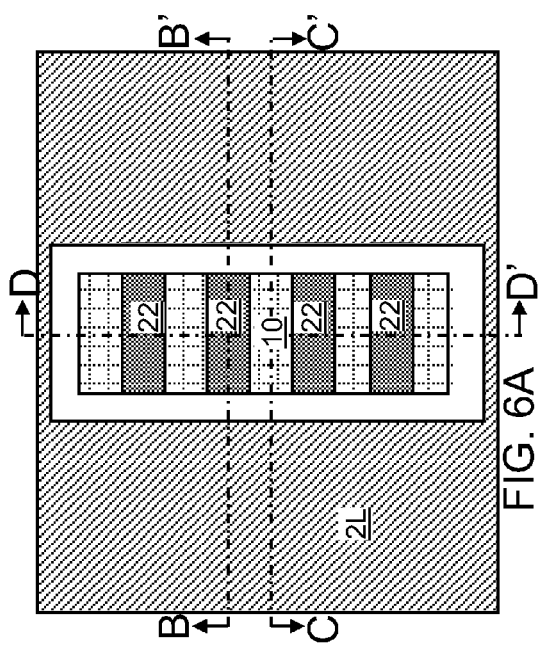
FIG. 6C is a vertical cross-sectional view of the exemplary semiconductor structure along the vertical plane C-C' of FIG. 6A.
Figure 6D:
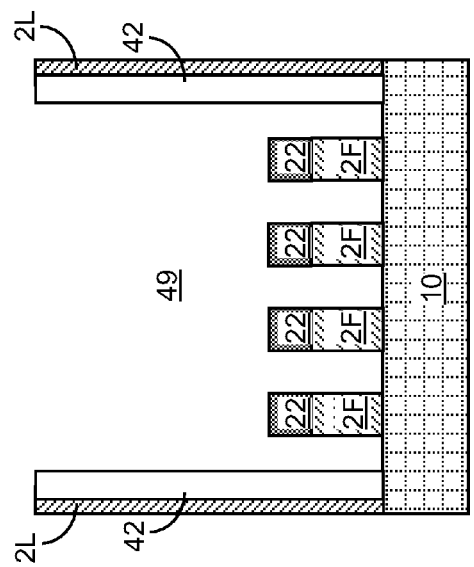
FIG. 6D is a vertical cross-sectional view of the exemplary semiconductor structure along the vertical plane D-D' of FIG. 6A.

As stated above, the present disclosure relates to a fin field effect transistor (finFET) including self-aligned raised active regions, and a method of manufacturing the same. Aspects of the present disclosure are now described in detail with accompanying figures. It is noted that like reference numerals refer to like elements across different embodiments. The drawings are not necessarily drawn to scale.

Referring to FIGS. 1A-1D, an exemplary semiconductor structure according to an embodiment of the present disclosure includes an insulator layer 10 and a single crystalline compound semiconductor material layer 20L. The insulator layer 10 can be a single crystalline compound insulator material. As used herein, an insulator material refers to a material having a resistivity greater than $1.0 \times 10^3$ Ohm-cm. As used herein, a compound insulator material refers to an insulator material that includes a compound of at least two elements. The compound insulator material can be a III-V compound including a Group III element and a Group V element, or can be a II-V compound including a Group II element and a Group VI element. As used herein, a single crystalline compound insulator material refers to a compound insulator material that is single crystalline, i.e., having its atoms in a near-perfect periodic arrangement throughout the entirety of the compound insulator material. In one embodiment, the single crystalline compound insulator material of the insulator layer 10 can be gallium arsenide (GaAs) doped with, for example, chromium (Cr) to make it insulating. The single crystalline compound insulator material of the insulator layer 10 can also be indium phosphide (InP) doped with, for example, iron (Fe) to make it insulating.

The single crystalline compound semiconductor material layer 20L includes a single crystalline compound semiconductor material in epitaxial alignment with the single crystalline compound insulator material of the insulator layer 10. As used herein, a semiconductor material refers to a material having a resistivity less than $1.0 \times 10^3$ Ohm-cm and greater than $1.0 \times 10^{-3}$ Ohm-cm. As used herein, a compound semiconductor material refers to a semiconductor material that includes a compound of at least two elements. The thickness of the single crystalline compound semiconductor material layer 20L can be in a range from 12 nm to 80 nm, although lesser and greater thicknesses can also be employed.

The single crystalline compound semiconductor material of the single crystalline compound semiconductor material layer 20L can be in epitaxial alignment with the single crystalline compound insulator material of the insulator layer 10. In one embodiment, the single crystalline compound semiconductor material layer 20L can be formed by epitaxial deposition of the single crystalline compound semiconductor material upon the insulator layer 10. In one embodiment, metal organic chemical vapor deposition (MOCVD) or molecular beam epitaxy (MBE) can be employed to deposit the single crystalline compound semiconductor material layer 20L with epitaxial alignment to the insulator layer 10. In one embodiment, the single crystalline compound semiconductor material can be indium gallium arsenide (InGaAs).

At least one fin-defining mask structure 22 can be formed over the top semiconductor layer 20L. Each of the at least one fin-defining mask structure 22 is a mask structure that covers at least a region of the top semiconductor layer 20L that is subsequently converted into a semiconductor fin. Thus, the at least one fin-defining mask structure 22, in conjunction with a disposable gate structure and a gate spacer to be subsequently formed, is employed to define the area of the semiconductor fins in a subsequent processing step. The at least one fin-defining mask structure 22 can include a dielectric material such as silicon nitride, silicon oxide, and silicon oxynitride.

The at least one fin-defining mask structure 22 can be formed, for example, by depositing a planar dielectric material layer and lithographically patterning the dielectric material layer. The planar dielectric material layer can be deposited, for example, by chemical vapor deposition (CVD). The thickness of the planar dielectric material layer can be from 5 nm to 100 nm, although lesser and greater thicknesses can also be employed.

Referring to FIGS. 2A-2D, a disposable gate structure 40 can be formed, for example, by first depositing a disposable gate material layer (not shown). Thereafter, the deposited disposable gate material layer can be lithographically patterned. A remaining portion of the disposable gate material layer after the lithographic patterning constitutes the disposable gate structure 40.

The disposable gate material layer includes a material that can be removed selective to the material of the at least one fin-defining mask structure 22 and selective to the material of the top semiconductor layer 20L. In this case, the disposable gate material layer can include a semiconductor material that is different from the semiconductor material of the top semiconductor layer 20L, a dielectric material, or a metallic material. Exemplary semiconductor materials that can be employed for the disposable gate material layer include silicon, germanium, a silicon germanium alloy, a silicon carbon alloy, a compound semiconductor material, or a combination thereof. The disposable gate material can be poly-crystalline material or an amorphous material. The disposable gate material layer can be deposited, for example, by chemical vapor deposition (CVD). The thickness of the disposable gate material layer, as measured above a planar surface, can be from 50 nm to 600 nm, although lesser and greater thicknesses can also be employed. In one embodiment, the semiconductor material of the top semiconductor layer 20L can be indium gallium arsenide (InGaAs) and the material of the disposable gate material layer can be germanium, a silicon germanium alloy, undoped silicon oxide, doped silicon oxide, or a combination thereof.

A photoresist layer (not shown) can be applied over the disposable gate material. The photoresist layer can be subsequently patterned into gate patterns, which can include a line which runs perpendicular to and intersect the at least one fin-defining mask structure 22. Physically exposed portions of the disposable gate material layer, i.e., portions of the disposable gate material layer that are not covered by the patterned photoresist layer, are removed, for example, by an etch, which can be an anisotropic etch. The etch that removes physically exposed portions of the disposable gate material layer can be selective to the materials of the at least one fin-defining mask structure 22. The photoresist layer can be subsequently removed.

A conformal dielectric material layer is deposited and anisotropically etched to for a gate spacer 42 that laterally surrounds the disposable gate structure 40. The gate spacer 42 can include a dielectric material that is different from the dielectric material of the at least one fin-defining mask structure 22. The gate spacer 42 can include, for example, silicon oxide, silicon nitride, and/or silicon oxynitride.

Referring to FIGS. 3A-3D, physically exposed portions of the at least one fin-defining mask structure 22 and the top semiconductor layer 20L (See FIGS. 2A-2D) are etched employing the combination of the disposable gate structure 40 and the gate spacer 42 as an etch mask. The removal of the physically exposed portions of the at least one fin-defining mask structure 22 and the top semiconductor layer 20L can be performed by an anisotropic etch, which can be, for example, a reactive ion etch. Top surfaces of the insulator layer 10 are physically exposed after the anisotropic etch. Optionally, the anisotropic etch can be selective to the insulator material of the insulator layer 10. In other embodiment, some collateral etching into layer the insulator layer 10 may occur.

A contiguous remaining portion of the top semiconductor layer 20L constitutes a semiconductor material portion 20P. In one embodiment, the horizontal cross-sectional area of the semiconductor material portion 20P can be the same as combined horizontal cross-sectional areas of the disposable gate structure 40 and the gate spacer 42. In one embodiment, sidewalls of the semiconductor material portion 20P can be vertically coincident with outer sidewalls of the gate spacer 42. As used herein, a first surface and a second surface are vertically coincident with each other if there exists a vertical plane including the first surface and the second surface. The lateral dimension L of the semiconductor material portion 20P is greater than the width of each of the at least one fin-defining mask structure 22.

Referring to FIGS. 4A-4D, a source/drain layer 2L can be grown from physically exposed surfaces of the insulator layer 10 and from the exposed sidewalls of layer 20P. The source/drain layer 2L can include a doped single crystalline semiconductor material that is epitaxially aligned to the insulator layer 10. The semiconductor material can be deposited directly on physically exposed surfaces of the insulator layer 10. If the insulator layer 10 is single crystalline, the deposited semiconductor material can also be single crystalline. The source/drain layer 2L includes a doped semiconductor material subsequently to be patterned into a source region and a drain region.

For example, the source/drain layer 2L can be formed by a selective epitaxy process. The selective epitaxy process deposits a doped single crystalline compound semiconductor material on physically exposed single crystalline surfaces, which include the single crystalline surface of the insulator layer 10 and the single crystalline semiconductor surfaces of the semiconductor material portion 20P. The doped compound semiconductor material of the source/drain layer 2L can be a doped III-V compound semiconductor material or a doped II-VI compound semiconductor material. Doping of region 2S and the drain region 2D is typically achieved by introducing impurities into the crystal that primarily either substitute group III atoms or alternatively primarily substitute group V atoms. Common n-type impurities (dopants) for III-V semiconductors are silicon (Si), tin (Sn), sulfur (S) and tellurium (Te). Common p-type impurities (dopants) for III-V semiconductors are carbon (C), beryllium (Be), and zinc (Zn). We note that some dopants can be amphoteric (i.e. can be either n-type or p-type based on the host semiconductor. For example, carbon is a good p-type dopant in GaAs and InGaAs, but would yield n-type material when doping InP. For more complete information about doping in III-V please refer to E. Fred Schubert, Doping in III-V Semiconductors, Cambridge university press, 1993, which is incorporated here by reference.

The doped compound semiconductor material can be selected so that the deposited doped single crystalline compound semiconductor material and the single crystalline insulator material of the insulator layer 10 are latticed matched with each other. For example, the lattice mismatch between the deposited doped single crystalline compound semiconductor material and the single crystalline insulator material of the insulator layer 10 can be small enough (e.g., less than $(a_{10}-a_{2s})/a_{10}$, 1%, where $a_{10}$ is the lattice constant of insulator layer 10 and $a_{2s}$ is the lattice constant of the doped compound semiconductor material) to minimize strain and relaxation of the strain by formation of defects.

Formation of an intentionally lattice mismatched source/drain layer 2L having a lattice mismatch with respect to the single crystalline insulator material of the insulator layer 20 may be used to induce strain in the semiconductor material portion 20P. The strain in the channel can enhance carrier mobility and leads to higher drive current. To induce compressive strain in the semiconductor material portion 20P, a larger lattice constant semiconductor material is epitaxially deposited in the source/drain layer 2L. For example, when the insulator layer 10 includes InP and is the semiconductor material portion 20P includes $In_{0.53}Ga_{0.47}As$ (lattice matched to InP), the source/drain layer 2L can be realized using $In_{0.60}Ga_{0.40}As$ to induce compressive strain in the semiconductor material portion 20P. Similarly, to induce a tensile strain in the semiconductor material portion 20P, the source/drain layer 2L can be formed with a smaller lattice constant semiconductor material than the single crystalline dielectric material of the insulator layer 20. The deposited doped single crystalline compound semiconductor material can be in epitaxial alignment with the compound semiconductor material of the semiconductor material portion 20P. The source/drain layer 2L can be formed as an integral structure, i.e., a single contiguous structure.

In one embodiment, the doped compound semiconductor material of the source/drain layer 2L can be formed, for example, by a metal organic chemical vapor deposition (MOCVD) process or a metal organic molecular beam epitaxy (MOMBE). During the MOCVD process, precursor gases for reactants, and optionally an etchant if employed, are simultaneously or alternately flowed into a process chamber in which the exemplary semiconductor structure is placed. The precursor gases for reactants include at least one first precursor gas for at least one Group III element or at least one Group II element, and further include at least one second precursor gas for at least one Group V element or at least one Group VI element. The flow rates for the at least one first precursor gas and the at least one second precursor gas are selected such that there is an imbalance between deposited Group III elements and deposited Group V elements, or an imbalance between deposited Group II elements and deposited Group VI elements. For example to epitaxially deposit InGaAs trimethylindium (TMI) is used as the indium source, triethylgallium (TEG) is used as the gallium source and arsine ($AsH_3$) is used as the arsenic source. The growth temperature depends on the deposition method and the material deposited. For example, for MOMBE growth of InGaAs the deposition temperature is from about 450° C. to 550° C.

If the semiconductor material portion 20P is doped with p-type doping or n-type doping, the conductivity type of the doped compound semiconductor material can be the opposite of the conductivity type of the semiconductor material portion 20P. For example, the semiconductor material portion 20P can have a p-type doping and the source/drain layer 2L can have an n-type doping, or vice versa. In this case, the conductivity type of the semiconductor material portion 20P is herein referred to as a first conductivity type, and the conductivity type of the source/drain layer 2L is herein referred to as a second conductivity type, which is the opposite of the first conductivity type. Alternately, the semiconductor material portion 20P can be intrinsic, and the source/drain layer 2L can be p-doped or n-doped.

For group IV semiconductor (e.g. silicon and SiGe) the use of an etchant gas (such as HCl) is needed to obtain a selective epitaxy process. For III-V semiconductors the use of such an etchant gas is typically not required and selective epitaxy is obtained by default when using chemical methods (e.g. MOCVD and MOMBE but not MBE where the elements are evaporated from Knudsen effusion cells). During the selective epitaxy process, single crystalline compound semiconductor materials are deposited on single crystalline surfaces at a faster deposition rate than the rate at which amorphous compound semiconductor materials are deposited on amorphous surfaces. The amorphous surfaces include the surfaces of the gate spacer 42, and may optionally include the top surface of the disposable gate structure 40. The etch rate of the etchant gas is substantially independent of the crystallinity of the deposited compound semiconductor material. The flow rate of the etchant gas is set such that the etch rate of the amorphous compound semiconductor materials is greater than the deposition rate of the amorphous compound semiconductor materials and less than the deposition rate of the single crystalline compound semiconductor materials. In this case, there is no net deposition of the doped compound semiconductor material on the amorphous surfaces of the gate spacer 42 and the disposable gate structure 40, while the source/drain layer 2L is formed on the physically exposed surfaces of the insulator layer 10 and the semiconductor material portion 20P.

The single crystalline compound semiconductor material can be deposited at least up to the height of the topmost surface of the gate spacer 42, and can be deposited above the topmost surface of the disposable gate structure 40. Portions of the deposited semiconductor material can be removed from above a horizontal plane located above the top surface of the semiconductor material portion 20P by a planarization process. The planarization process is performed, for example, by chemical mechanical planarization (CMP). A top portion of the disposable gate structure 40 can be removed during the planarization process. Top portions of the source/drain layer 2L can be removed during the planarization process such that top surfaces of remaining portions of the deposited single crystalline semiconductor material portions are coplanar with a top surface of a remaining portion of the disposable gate structure 40. The remaining portions of the deposited semiconductor material constitutes the source/drain layer 2L. In addition, the top surface of a remaining portion of the gate spacer 42 can be coplanar with the top surfaces of the source/drain layer 2L. The source/drain layer 2L includes a bottom surface that contacts, and is epitaxially aligned to, the insulator layer 10. In one embodiment, the source/drain layer 2L can be epitaxially aligned to the semiconductor material portion 20P. In another embodiment, the source/drain layer is not epitaxially aligned to the semiconductor material portion 20P.

Referring to FIGS. 5A-5D, the disposable gate structure 40 is removed selective to the source/drain layer 2L, the gate spacer 42, that at least one fin-defining mask structures 22, and the semiconductor material portion 20P. A gate cavity 49 is formed within a volume from which the disposable gate structure 40 is removed. For example, if the disposable gate structure 40 comprise of poly-silicon, a wet etch using tetramethylammonium hydroxide (TMAH) can be used to etch out disposable gate structure 40.

Referring to FIGS. 6A-6D, at least one semiconductor fin 2F is formed by etching the semiconductor material portion 20P employing the combination of the gate spacer 42 and the at least one fin-defining mask structure 22 as an etch mask. For example, an anisotropic etch is performed employing the at least one fin-defining mask structure 22 as an etch mask to etch physically exposed portions of the semiconductor material portion 20P (See FIGS. 5A-5D). In one embodiment, the anisotropic etch can be selective to the gate spacer 42 and the source/drain layer 2L. The anisotropic etch can proceed until a top surface of the insulator layer 10 is physically exposed. In some embodiments, the compound semiconductor materials of the semiconductor material portion 20P and the source/drain layer 2L can be the same (for example, a fin made of InGaAs and a source and drain made of doped InGaAs). In this case, the etching of the fins would also etch the top portion of the source/drain layer 2L. To circumvent the recess of the source and drain during fin etching, a thin layer of InP (or other suitable material) can be epitaxially deposited over the source/drain layer 2L. Now that the source/drain layer 2L is capped with a material different than the fin material, it is possible to etch the fins without etching into the source/drain layer 2L.

The remaining portion of the semiconductor material portion 20P is herein referred to as a patterned semiconductor material portion (2F, 2R) and includes at least one semiconductor fin 2F having a uniform width and a pair of end portions 2R, which are herein referred to as a first end portion and a second end portion, respectively. Each semiconductor fin 2F underlies a fin-defining mask structure 22, and can have substantially the same width as the width of the overlying fin-defining mask structure 22. The end portions 2R can have a same width as the gate spacer 42. The length of each end portion 2R along the direction perpendicular to the lengthwise direction of the at least one semiconductor fin 2F can be the same as the lateral dimension L of the semiconductor material portion 20P prior to patterning (See FIG. 3D). Thus, each end portion 2R laterally extends farther than a width of any of said at least one semiconductor fin 2F. It is noted that the width of any semiconductor fin 2F is measured along a direction perpendicular to the lengthwise direction of the semiconductor fin 2F.

The entirety of a sidewall of the source/drain layer 2L can be vertically coincident with a sidewall of one of the end portions 2R, and the entirety of another sidewall of the source/drain layer 2L can be vertically coincident with another sidewall of the other of the end portions 2R. Portions of the top surface of the insulator layer 10 are physically exposed in regions not covered by the at least one semiconductor fin 2F, the semiconductor material portion 2R, and the source/drain layer 2L after formation of the at least one semiconductor fin 2F. Further, if the at least one semiconductor fin 2F is a plurality of semiconductor fins, portions of the top surface of the insulator layer 10 are physically exposed between each neighboring pair of semiconductor fins 2F.

Referring to FIGS. 7A-7D, optionally, the at least one fin-defining mask structure 22 can be removed selective to the at least one semiconductor fin 2F and the semiconductor material portion 2R by an isotropic etch, which can be, for example, a wet etch.

Figure 8B:
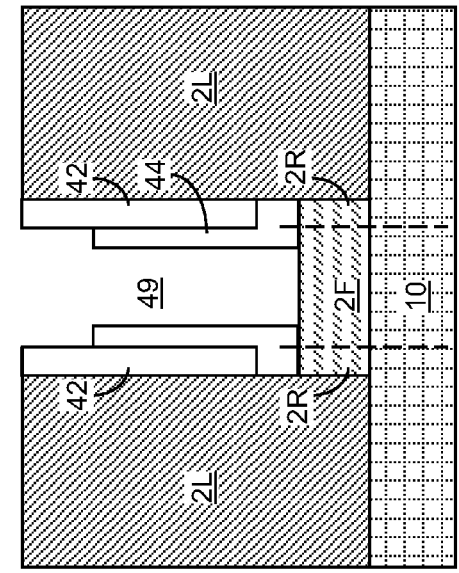
FIG. 8B is a vertical cross-sectional view of the exemplary semiconductor structure along the vertical plane B-B' of FIG. 8A.
Figure 8C:
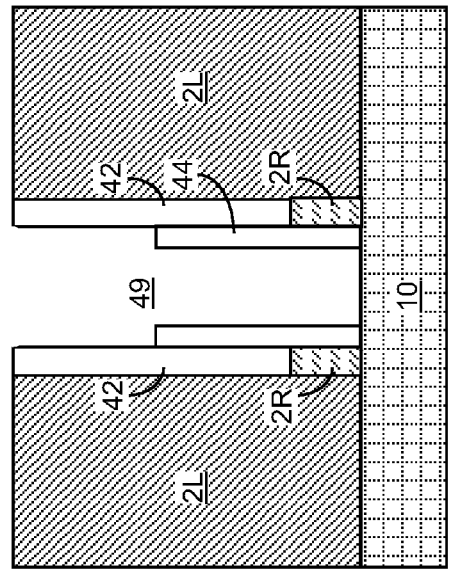
FIG. 8C is a vertical cross-sectional view of the exemplary semiconductor structure along the vertical plane C-C' of FIG. 8A.
Figure 8A:
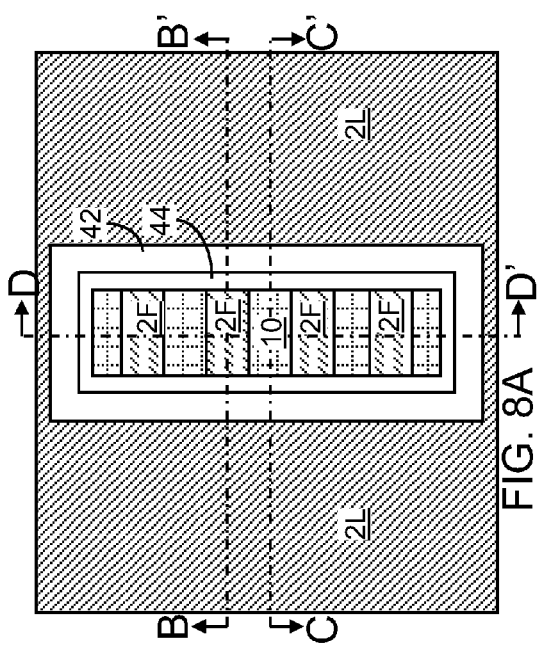
FIG. 8A is a top-down view of the exemplary semiconductor structure after formation of an inner gate spacer according to an embodiment of the present disclosure.
Figure 8D:
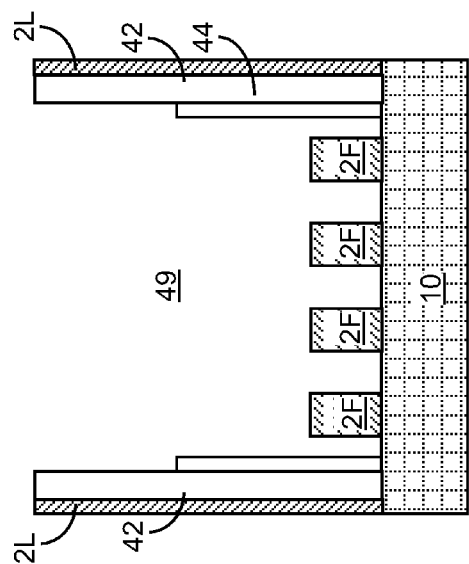
FIG. 8D is a vertical cross-sectional view of the exemplary semiconductor structure along the vertical plane D-D' of FIG. 8A.
Figure 9B:
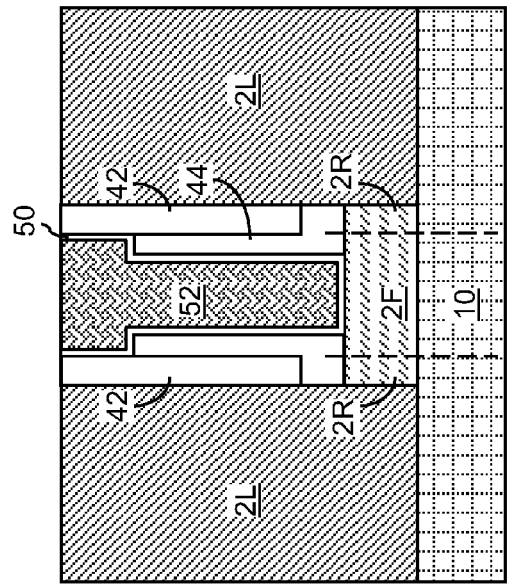
FIG. 9B is a vertical cross-sectional view of the exemplary semiconductor structure along the vertical plane B-B' of FIG. 9A.
Figure 9C:
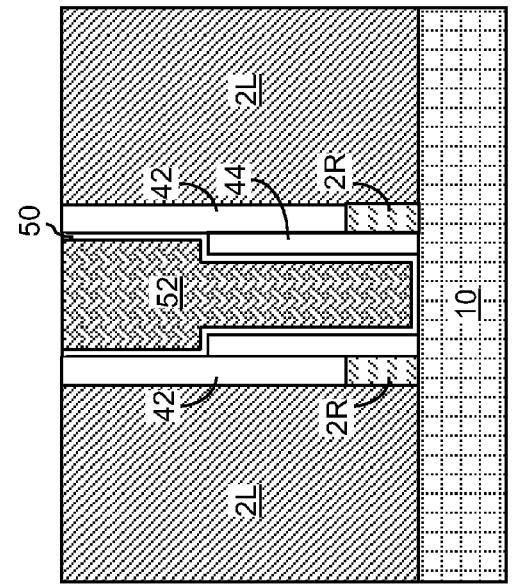
FIG. 9C is a vertical cross-sectional view of the exemplary semiconductor structure along the vertical plane C-C' of FIG. 9A.
Figure 9A:
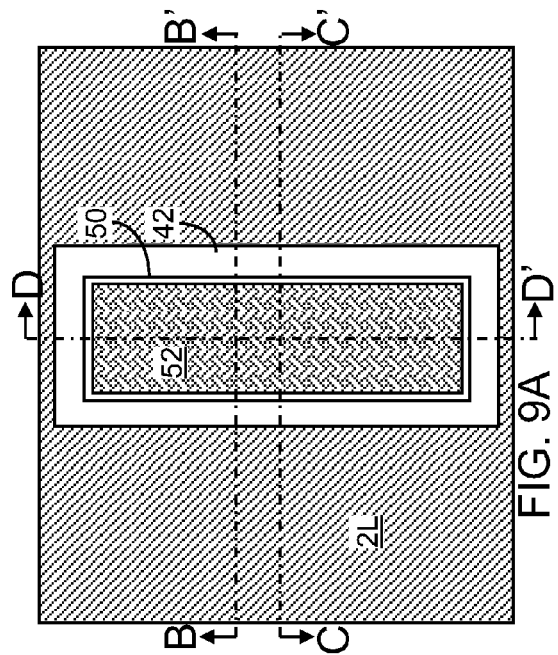
FIG. 9A is a top-down view of the exemplary semiconductor structure after formation of a replacement gate structure according to an embodiment of the present disclosure.
Figure 9D:
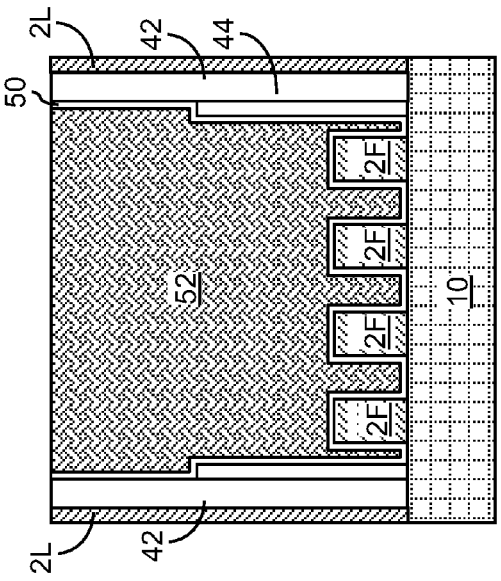
FIG. 9D is a vertical cross-sectional view of the exemplary semiconductor structure along the vertical plane D-D' of FIG. 9A.
Figure 10A:
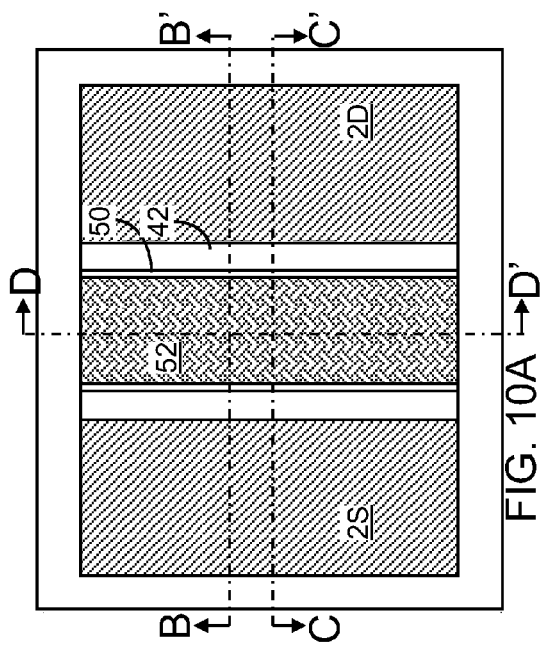
FIG. 10A is a top-down view of the exemplary semiconductor structure after optional trimming of the source region and the drain region according to an embodiment of the present disclosure.
Figure 10B:
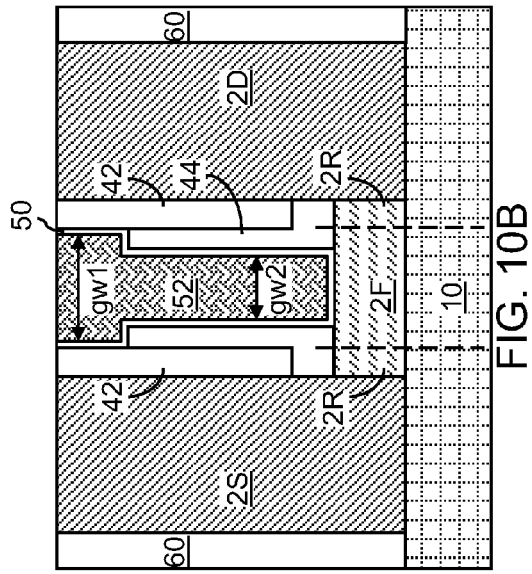
FIG. 10B is a vertical cross-sectional view of the exemplary semiconductor structure along the vertical plane B-B' of FIG. 10A.
Figure 10C:
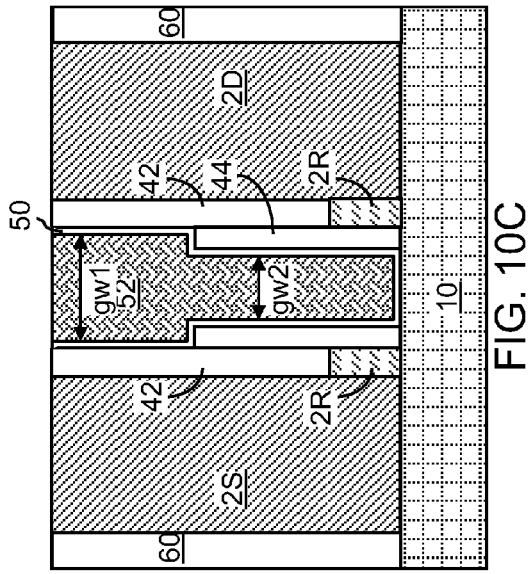
FIG. 10C is a vertical cross-sectional view of the exemplary semiconductor structure along the vertical plane C-C' of FIG. 10A.
Figure 10D:
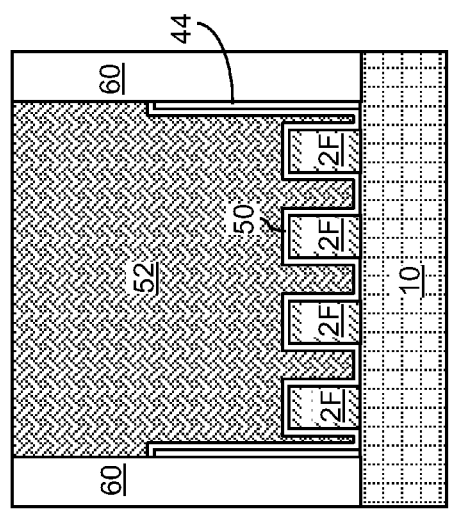
FIG. 10D is a vertical cross-sectional view of the exemplary semiconductor structure along the vertical plane D-D' of FIG. 10A.

Referring to FIGS. 8A-8D, optionally, an inner gate spacer 44 can be formed within the gate cavity 49. The inner gate spacer 44 is another gate spacer that includes a dielectric material. The inner gate spacer 44 is formed directly on portions of sidewall surfaces of the source/drain layer 2L. The inner gate spacer 44 laterally contacts inner sidewalls and bottom surfaces of the gate spacer 42. The inner gate spacer 44 can be formed by depositing a conformal dielectric material layer, and anisotropically etching the conformal dielectric material layer by an anisotropic etch such as a reactive ion etch. The reactive ion etch can be selective to the at least one semiconductor fin 2F. The inner gate spacer 44 can include silicon oxide, silicon nitride, silicon oxynitride, and/or porous or non-porous organosilicate glass (OSG). As shown in FIGS. 8C and 8D the reactive ion etching applied to form the spacer 44 is targeted to remove the spacer from over the sidewalls of fins 2F while keeping the spacer 44 on the sidewalls of source/drain layer 2L. This is possible to do since the sidewalls of the source/drain layer 2L are taller than the sidewalls of semiconductor fins 2F.

Referring to FIGS. 9A-9D, a replacement gate structure (50, 52) is formed within the gate cavity 49. Specifically, a gate dielectric 50 and a gate electrode 52 can be formed within the gate cavity 49. The gate dielectric 50 can be formed directly on each lengthwise sidewall of the at least one semiconductor fin 2F. The gate dielectric 50 can be formed as a single contiguous layer, for example, by deposition of a dielectric material by chemical vapor deposition (CVD) or atomic layer deposition (ALD), or can be formed by a set of non-contiguous material portions that are formed only on lengthwise sidewalls of the at least one semiconductor fin 2F, for example, by conversion of surface portions of the semiconductor material of the at least one semiconductor fin 2F into a dielectric material such as silicon oxide, silicon nitride, or silicon oxynitride.

The gate electrode 52 can be formed by filling the gate trench 49 with at least one conductive material such as at least one metallic material and/or at least one doped semiconductor material. The gate electrode 52 overlies the at least one semiconductor fin 2F, and is in contact with the gate dielectric 50. Excess portions of the at least one conductive material can be removed from above the top surface of the source/drain layer 2L, for example, by chemical mechanical planarization. The stack of the gate dielectric 50 and the gate electrode 52 replaces the disposable gate structure 40 (see FIGS. 4A-4D), and is therefore referred to as a replacement gate structure.

The stack of the gate dielectric 50 and the gate electrode 52 straddles the at least one semiconductor fin 2F.

Referring to FIGS. 10A-10D, the source/drain layer 2L can be patterned to form a source region 2S and a drain region 2D. The source/drain layer 2L may be laterally trimmed, for example, by forming trenches around the source/drain layer 2L, and filling the trenches with a dielectric material. The trenches can extend from the top surfaces of the source region 2S and the drain region 2D to the top surface of the insulator layer, and can be formed, for example, by application and patterning of a photoresist layer (not shown) and transfer of the pattern in the photoresist layer through the source region 2S and the drain region 2D by an anisotropic etch. The dielectric material can include silicon oxide, silicon nitride, silicon oxynitride, and/or porous or non-porous organosilicate glass (OSG). Excess portions of the dielectric material can be removed from above the top surfaces of the source region 2S and the drain region 2D. The dielectric material filling the trenches constitute trench isolation structures 60, which can have top surfaces that are coplanar with the top surfaces of the source region 2S and the drain region 2D and can contact the insulator layer 10.

The exemplary semiconductor structure contains at least one semiconductor fin 2F connecting the two end portions 2R and located on an insulator layer 10, a gate stack (50, 52) including a gate dielectric 50 and a gate electrode 52 and overlying the at least one semiconductor fin 2F, a source region 2S contacting one of the two end portions 2R, and a drain region 2D contacting another of the two end portions 2R.

The gate spacer 42 includes outer sidewalls that are vertically coincident with outer sidewalls of the semiconductor material portion 2R. The gate spacer 42 is vertically spaced from the insulator layer 10 by at least a height of the at least one semiconductor fin 2F. The inner gate spacer 44 is in contact with the insulator layer 10. The inner gate spacer 44 contacts inner sidewalls of the gate spacer 42 and sidewalls of the at least one semiconductor fin 2F. The inner gate spacer 44 includes laterally protruding portions that underlie the gate spacer 42 and contact the source region 2S or the drain region 2D. The gate electrode 52 has an upper portion having a first lateral width gw1 and a lower portion having a second lateral width gw2 that is less than the first lateral width gw1.

A sidewall of the source region 2S is vertically coincident with a sidewall of one of the end portions 2R, and a sidewall of the drain region 2D is vertically coincident with a sidewall of the other of the end portions 2R. Top surfaces of the source region 2S and the drain region 2D are coplanar with a top surface of the gate electrode 52. In one embodiment, the at least one semiconductor fin 2F can have a doping of a first conductivity type, and the source region 2S and the drain region 2D can have a doping of a second conductivity type that is the opposite of the first conductivity type. In one embodiment, the insulator layer 10 can be single crystalline, and the source region 2S and the drain region 2D can be single crystalline, and can be epitaxially aligned to a crystalline structure of the insulator layer 10.

Referring to FIGS. 11A and 11B, a contact level dielectric layer 70 can be formed over the source region 2S, the drain region 2D, and the gate electrode 52. Various contact via structures (7S, 7D, 7G) can be formed through the contact level dielectric layer 70. The various contact via structures (7S, 7D, 7G) can include, for example, a source-side contact via structure 7S that contacts the source region 2S, a drain-side contact via structure 7D that contacts the drain region 2D, and a gate-side contact via structure 7G that contacts the gate electrode 52. The at least one semiconductor fin 2F (See FIGS. 10A-10D) and the end portions 2R (See FIGS. 10A-10D) collectively function as a body region 2B of the field effect transistor.

Figure 12B:
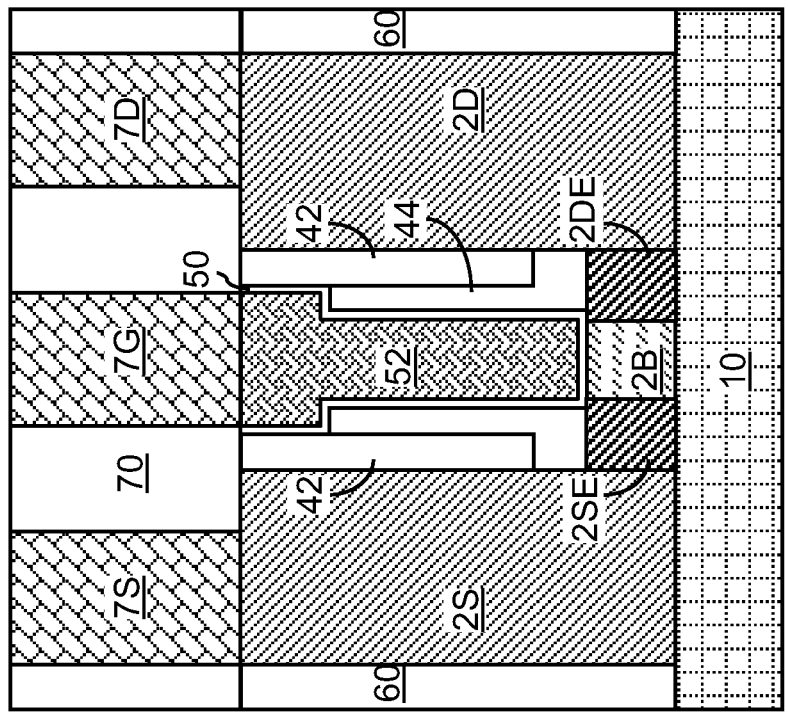
FIG. 12B is a vertical cross-sectional view of the exemplary semiconductor structure along the vertical plane B-B' of FIG. 12A.
Figure 12A:
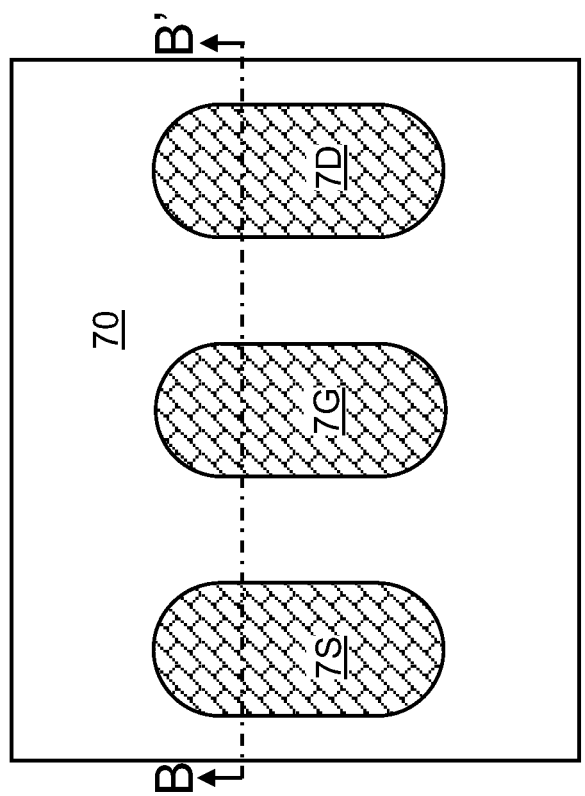
FIG. 12A is a top-down view of a first variation of the exemplary semiconductor structure in which a source extension region and a drain extension region are formed according to an embodiment of the present disclosure.

Referring to FIGS. 12A and 12B, a first variation of the exemplary semiconductor structure can be derived from the exemplary semiconductor structure by forming a source extension region 2SE and a drain extension region 2DE. The source extension region 2SE and the drain extension region 2DE can be formed, for example, by causing the dopants in the source region 2S and the drain region 2D to laterally diffuse into adjacent portions of the end portions 2R (See FIGS. 10A-10D) and optionally into end portions of the at least one semiconductor fin 2F (See FIGS. 10A-10D). The remaining portions of the at least one semiconductor fin 2F (See FIGS. 10A-10D) constitute at least one body regions 2B.

Figure 13B:
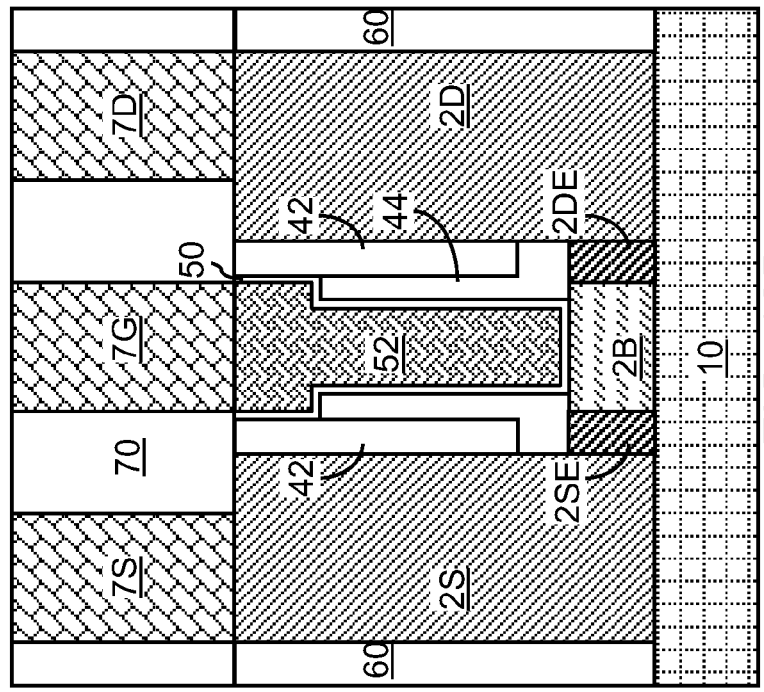
FIG. 13B is a vertical cross-sectional view of the exemplary semiconductor structure along the vertical plane B-B' of FIG. 13A.
Figure 13A:
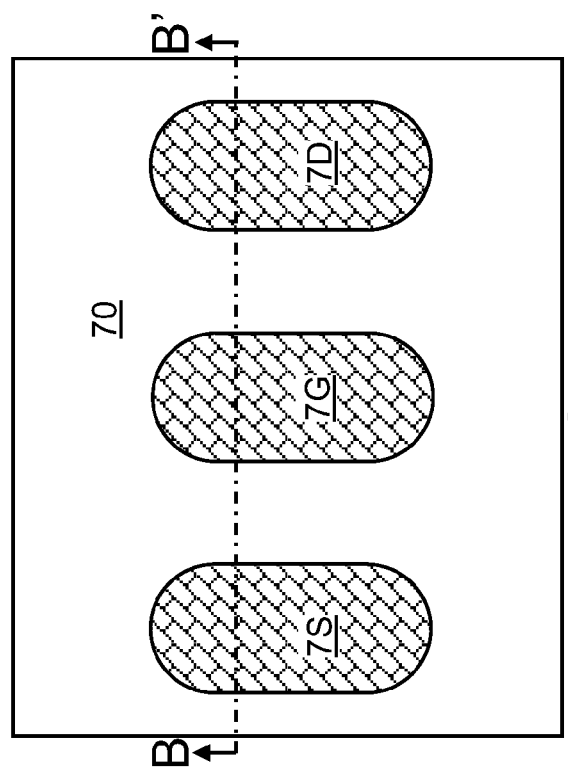
FIG. 13A is a top-down view of a second variation of the exemplary semiconductor structure in which a source extension region and a drain extension region are formed according to an embodiment of the present disclosure.

Referring to FIGS. 13A and 13B, a second variation of the exemplary semiconductor structure can be derived from the exemplary semiconductor structure by forming a source extension region 2SE and a drain extension region 2DE. The source extension region 2SE and the drain extension region 2DE can be formed, for example, by causing the dopants in the source region 2S and the drain region 2D to laterally diffuse into adjacent portions of the end portions 2R (See FIGS. 10A-10D). The remaining portions of the at least one semiconductor fin 2F (See FIGS. 10A-10D) constitute at least one body regions 2B.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A semiconductor structure comprising:
a single crystalline insulator layer;
a semiconductor material portion located on, and in epitaxial alignment with, said single crystalline insulator layer, said semiconductor material portion including at least one semiconductor fin, a first end portion adjoined to one end of each of said at least one semiconductor fin, and a second end portion adjoined to another end of each of said at least one semiconductor fin, each of said first and second end portion laterally extending farther than a width of any of said at least one semiconductor fin;
a gate stack including a gate dielectric and a gate electrode and overlying said at least one semiconductor fin;
a source region contacting said first end portion and epitaxially aligned to said single crystalline insulator layer; and
a drain region contacting said second end portion and epitaxially aligned to said single crystalline insulator layer.

2. The semiconductor structure of claim 1, further comprising a gate spacer having outer sidewalls that are vertically coincident with outer sidewalls of said semiconductor material portion.

3. The semiconductor structure of claim 2, further comprising another gate spacer contacting inner sidewalls of said gate spacer and sidewalls of said at least one semiconductor fin.

4. The semiconductor structure of claim 3, wherein said gate spacer is vertically spaced from said insulator layer by at least a height of said at least one semiconductor fin, and said another gate spacer is in contact with said insulator layer.

5. The semiconductor structure of claim 2, wherein said gate electrode has an upper portion having a first lateral width and a lower portion having a second lateral width that is less than said first lateral width.

6. The semiconductor structure of claim 3, wherein said another gate spacer comprises laterally protruding portions that underlie said gate spacer and contact said source region or said drain region.

7. The semiconductor structure of claim 1, wherein a sidewall of said source region is vertically coincident with a sidewall of said semiconductor material portion, and a sidewall of said drain region is vertically coincident with another sidewall of said semiconductor material portion.

8. The semiconductor structure of claim 1, wherein top surfaces of said source region and said drain region are coplanar with a top surface of said gate electrode.

9. The semiconductor structure of claim 1, wherein said source region and said drain region have a lattice constant that is different from a lattice constant of said semiconductor fin.

10. The semiconductor structure of claim 1, wherein each of said at least one semiconductor fin is strained along a lengthwise direction.

* * * * *